United States Patent [19]
Baliga

[11] Patent Number: 5,612,567
[45] Date of Patent: Mar. 18, 1997

[54] SCHOTTKY BARRIER RECTIFIERS AND METHODS OF FORMING SAME

[75] Inventor: Bantval J. Baliga, Raleigh, N.C.

[73] Assignee: North Carolina State University, Raleigh, N.C.

[21] Appl. No.: 645,231

[22] Filed: May 13, 1996

[51] Int. Cl.$^6$ .......................... H01L 27/095; H01L 29/00; H01L 29/93

[52] U.S. Cl. .......................... 257/475; 257/476; 257/510; 257/513; 257/596

[58] Field of Search ................................. 257/475, 476, 257/655, 657, 622, 623, 510, 513, 514, 515, 471, 480, 267, 656, 595, 596, 597, 598, 599, 600, 264, 481, 482, 603, 917

[56] References Cited

U.S. PATENT DOCUMENTS

| | | | |
|---|---|---|---|
| 4,641,174 | 2/1987 | Baliga | 257/264 |
| 4,982,260 | 1/1991 | Chang et al. | 357/38 |
| 5,262,669 | 11/1993 | Wakatabe et al. | 257/622 |
| 5,365,102 | 11/1994 | Mehrotra et al. | 257/475 |

FOREIGN PATENT DOCUMENTS 402111070  4/1990  Japan ..................... 257/622

OTHER PUBLICATIONS

M. Mehrotra et al., *Trench MOS Barrier Schottky (TMBS) Rectifier: A Schottky Recitifer With Higher Than Parallel Plane Breakdown Voltage*, Solid-State Electronics, vol. 38, No. 4, 1995, pp. 801–806.

B. Jayant Baliga, *Power Rectifiers*, Chapter 4, Power Semiconductor Devices, 1995, pp. 128–197.

Primary Examiner—Mahshid D. Saadat
Assistant Examiner—Ida M. Soward
Attorney, Agent, or Firm—Bell, Seltzer, Park & Gibson

[57] ABSTRACT

A Schottky rectifier includes MOS-filled trenches and an anode electrode at a face of a semiconductor substrate and an optimally nonuniformly doped drift region therein which in combination provide high blocking voltage capability with low reverse-biased leakage current and low forward voltage drop. The nonuniformly doped drift region contains a concentration of first conductivity type dopants therein which increases monotonically in a direction away from a Schottky rectifying junction formed between the anode electrode and the drift region. A profile of the doping concentration in the drift region is preferably a linear or step graded profile with a concentration of less than about $5 \times 10^{16}$ cm$^{-3}$ (e.g., $1 \times 10^{16}$ cm$^{-3}$) at the Schottky rectifying junction and a concentration of about ten times greater (e.g., $3 \times 10^{17}$ cm$^{-3}$) at a junction between the drift region and a cathode region. The thickness of the insulating regions (e.g., SiO$_2$) in the MOS-filled trenches is also greater than about 1000 Å to simultaneously inhibit field crowding and increase the breakdown voltage of the device. The nonuniformly doped drift region is preferably formed by epitaxial growth from the cathode region and doped in-situ.

38 Claims, 10 Drawing Sheets

SCHOTTKY BARRIER RECTIFIERS AND METHODS OF FORMING SAME

FIELD OF THE INVENTION

This invention relates to rectifiers and more particularly to metal-semiconductor rectifying devices, and methods of forming these devices.

BACKGROUND OF THE INVENTION

Schottky barrier rectifiers are used extensively as output rectifiers in switching-mode power supplies and in other high-speed power switching applications, such as motor drives, for carrying large forward currents and supporting reverse blocking voltages of up to 100 Volts. Schottky barrier rectifiers are also applicable to a wide range of other applications such as those illustrated in FIG. 1. As is well known to those having skill in the art, rectifiers exhibit low resistance to current flow in a forward direction and a very high resistance to current flow in a reverse direction. As is also well known to those having skill in the art, a Schottky barrier rectifier produces rectification as a result of nonlinear unipolar current transport across a metal-semiconductor contact.

There are basically four distinct processes for the transport of predominantly unipolar charge carriers across a metal/N-type semiconductor contact. The four processes are (1) transport of electrons from the semiconductor over a metal/semiconductor potential barrier and into the metal (thermionic emission), (2) quantum-mechanical tunneling (field emission) of electrons through the barrier, (3) recombination in the space-charge region and (4) hole injection from the metal to the semiconductor. In addition, edge leakage currents, caused by high electric fields at the metal contact periphery, as well as interface currents, caused by the presence of traps at the metal-semiconductor interface, may also be present.

Current flow by means of thermionic emission (1) is generally the dominant process for Schottky power rectifiers with moderately doped semiconductor regions (e.g., Si with doping concentration $\leq 1\times10^{16}$ cm$^{-3}$), operated at moderate temperatures (e.g., 300K). Moderate doping of the semiconductor region also generally produces a relatively wide potential barrier between the metal and semiconductor regions and thereby limits the proportion of current caused by tunneling (2). Space-charge recombination current (3) is similar to that observed in a P-N junction diode and is generally significant only at very low forward current densities. Finally, current transport due to minority carrier injection (4) is generally significant only at large forward current densities.

As the voltages of modern power supplies continue to decrease in response to need for reduced power consumption and increased energy efficiency, it becomes more advantageous to decrease the on-state voltage drop across a power rectifier, while still maintaining high forward-biased current density levels. As well known to those skilled in the art, the on-state voltage drop is generally dependent on the forward voltage drop across the metal/semiconductor junction and the series resistance of the semiconductor region and cathode contact.

The need for reduced power consumption also generally requires minimizing the reverse-biased leakage current. The reverse-biased leakage current is the current in the rectifier during a reverse-biased blocking mode of operation. To sustain high reverse-biased blocking voltages and minimize reverse-biased leakage currents, the semiconductor portion of the rectifier is typically lightly doped and made relatively thick so that the reverse-biased electric field at the metal/semiconductor interface does not become excessive. The magnitude of the reverse-biased leakage current for a given reverse-biased voltage is also inversely dependent on the Schottky barrier height (potential barrier) between the metal and semiconductor regions. Accordingly, to achieve reduced power consumption, both the forward-biased voltage drop and reverse-biased leakage current should be minimized and the reverse blocking voltage should be maximized.

Unfortunately, there is a tradeoff between the forward-biased voltage drop and the reverse-biased leakage current in a Schottky barrier rectifier, so that it is generally difficult to minimize both characteristics simultaneously. In general, as the Schottky barrier height is reduced, the forward voltage drop decreases but the reverse-biased leakage current increases. Conversely, as the barrier height is increased, the forward voltage drop increases but the leakage current decreases. The doping level in the semiconductor region also plays a significant role. Generally, the higher the doping level, the lower the forward-biased voltage drop but the reverse-biased breakdown voltage is reduced because of impact-ionization.

Therefore, in designing Schottky barrier rectifiers, design parameters such as barrier heights and semiconductor doping levels are generally selected to meet the requirements of a particular application because all device parasitics cannot be simultaneously minimized. Low barrier heights are typically used for Schottky rectifiers intended for high current operation with large duty cycles, where the power losses during forward conduction are dominant. High barrier heights are typically used for Schottky rectifiers intended for applications with higher ambient temperatures or requiring high reverse blocking capability.

The height of the Schottky barrier formed by the metal/semiconductor junction is related to the work function potential difference between the metal contact and the semiconductor substrate. A graphical illustration of the relationship between metal work function and Schottky barrier height may be found in Chapter 5, FIG. 3 of the textbook by S. M. Sze entitled *Semiconductor Devices, Physics and Technology,* John Wiley & Sons, 1985, at page 163. A detailed and comprehensive discussion of the design of Schottky barrier power rectifiers may be found in Chapter 4 of a textbook by B. J. Baliga entitled *Power Semiconductor Devices,* PWS Publishing Co., ISBN 0-534-94098-6 (1995), the disclosure of which is hereby incorporated herein by reference. In particular, sections 4.1.2 and 4.1.3 of the Baliga textbook disclose the semiconductor physics associated with both forward conduction and reverse blocking in a parallel-plane Schottky rectifier, having the structure of FIG. 4.5 therein. As set forth in Equation 4.7, the forward voltage drop is dependent on the drift region, substrate and contact resistances ($R_D$, $R_S$ and $R_C$) and the forward current density ($J_F$), as well as the saturation current ($J_S$) which is a function of the Schottky barrier height ($\phi_{bn}$). The maximum reverse blocking voltage (i.e., breakdown voltage) of a Schottky rectifier (BV$_{pp}$) is also disclosed as ideally being equal to that of a one-sided abrupt parallel-plane P-N junction rectifier (e.g., P$^+$–N or N$^+$–P), having the structure of FIG. 3.3 of the Baliga textbook. The breakdown voltage (BV$_{pp}$) is dependent on the doping concentration of the drift region ($N_D$), as described by Equation (1) below.

$$N_D = 2\times10^{18}(BV_{pp})^{-4/3} \tag{1}$$

Equation (1) is a reproduction of Equation 4.11 from the aforementioned Baliga textbook. A graphical representation of breakdown voltage and depletion layer width ($W_{pp}$) at breakdown versus drift region doping ($N_D$) for an abrupt parallel-plane P-N junction rectifier is shown by FIG. 2. FIG. 2 is a reproduction of FIG. 3.4 from the aforementioned Baliga textbook.

In reality, however, the actual breakdown voltage of a conventional Schottky rectifier is about one-third (⅓) that for the abrupt parallel-plane P-N junction rectifier described by Equation (1) and graphically illustrated by FIG. 2. As will be understood by those skilled in the art, the reduction in breakdown voltage below the theoretical ideal parallel plane value is caused, in part, by image-force-induced lowering of the potential barrier between the metal and the semiconductor regions, which occurs at reverse-biased conditions.

One attempt to optimize the on-state voltage drop/reverse blocking voltage tradeoff associated with the Schottky barrier rectifier is the Junction Barrier controlled Schottky (JBS) rectifier. The JBS rectifier is a Schottky rectifier having an array of Schottky contacts at the face of a semiconductor substrate with corresponding semiconductor channel regions beneath the contacts. The JBS rectifier also includes a P-N junction grid interspersed between the Schottky contacts. This device is also referred to as a "pinch" rectifier, based on the operation of the P-N junction grid. The P-N junction grid is designed so that the depletion layers extending from the grid into the substrate will not pinch-off the channel regions to forward-biased currents, but will pinch-off the channel regions to reverse-biased leakage currents.

As will be understood by those skilled in the art, under reverse bias conditions, the depletion layers formed at the P-N junctions spread into the channel regions, beneath the Schottky barrier contacts. The dimensions of the grid and doping levels of the P-type regions are generally designed so that the depletion layers intersect under the array of Schottky contacts, when the reverse bias exceeds a few volts, and cause pinch-off. Pinch-off of the channels by the depletion layers cause the formation of a potential barrier in the substrate so that further increases in the reverse-biased voltage are supported by the depletion layers. Accordingly, once a threshold reverse-biased voltage is achieved, the depletion layers shield the Schottky barrier contacts from further increases in the reverse-biased voltage. This shielding effect generally prevents the lowering of the Schottky barrier potential at the interface between the metal contacts and semiconductor substrate and inhibits the formation of large reverse leakage currents.

The design and operation of the JBS rectifier is described in Section 4.3 of the aforementioned Baliga textbook and in U.S. Pat. No. 4,641,174 to Baliga, entitled Pinch Rectifier, the disclosure of which is hereby incorporated herein by reference. For example, as shown by FIG. 6 of the '174 patent, reproduced herein as FIG. 3, an embodiment of a pinch rectifier 200 comprises a plurality of Schottky rectifying contacts 232 formed by metal layer 230 and substrate 204 and a P-N junction grid formed by regions 234 and substrate 204. Unfortunately, the JBS rectifier typically possesses a relatively large series resistance and a relatively large on-state forward voltage drop caused by the reduction in overall Schottky contact area dedicated to forward conduction. This reduction in area is necessarily caused by the presence of the P-N junction grid which occupies a significant percentage of the total area at the face of the substrate. In addition, large forward currents can cause large forward voltage drops and can lead to the onset of minority carrier conduction (i.e., bipolar), which limits the performance of the JBS rectifier at high switching rates. Finally, although the reverse blocking voltage for the JBS may be somewhat higher than the reverse blocking voltage for a Schottky rectifier having an equivalent drift region doping ($N_D$), it generally does not achieve the level of reverse blocking capability attainable with a parallel-plane P-N junction, as illustrated by FIG. 2.

Another attempt to optimize the forward voltage drop/ reverse blocking voltage tradeoff is disclosed in U.S. Pat. No. 4,982,260 to Chang et al. entitled *Power Rectifier with Trenches*, the disclosure of which is hereby incorporated herein by reference. For example, as shown by FIGS. 10B and 14B, reproduced herein as FIGS. 4 and 5, respectively, conventional P-i-N rectifiers ($P^+$-$N^-$-$N^+$) are modified to include an interspersed array of Schottky contacts on a face of an N-type semiconductor substrate. As shown by FIG. 4, the Schottky contact regions 550A–C are separated from the $P^+$ portions 510A–D (of the P-i-N rectifier) by MOS trench regions 522A–522F. In another embodiment shown by FIG. 5, the Schottky contact regions 718A–E are interspersed adjacent the $P^+$ portions 720A–F, which are formed at the bottom of trenches 710A–F. As will be understood by those skilled in the art, these modified P-i-N rectifiers also typically possess an unnecessarily large series resistance in the drift region ($N^-$ regions 506, 706). Moreover, only a relatively small percentage of forward-conduction area is dedicated to the Schottky contacts, which dominate the forward bias characteristics by turning on at lower forward voltages than the parallel connected $P^+$-N junctions. Finally, although the forward leakage current for these P-i-N type rectifiers is substantially lower than the corresponding forward leakage current for a Schottky rectifier, like the JBS rectifier, they do not achieve the level of reverse blocking capability associated with an abrupt parallel-plane P-N junction.

However, U.S. Pat. No. 5,365,102 to Mehrotra and inventor Baliga, entitled *Schottky Barrier Rectifier with MOS Trench*, the disclosure of which is hereby incorporated herein by reference, discloses Schottky barrier rectifiers which have a higher breakdown voltage than theoretically attainable with an ideal abrupt parallel-plane P-N junction. A cross-sectional representation of one embodiment of the described rectifiers, referred to as the TMBS rectifier, is illustrated by FIG. 6 and described in an article by Mehrotra and inventor Baliga entitled *Trench MOS Barrier Schottky (TMBS) Rectifier: A Schottky Rectifier With Higher Than Parallel Plane Breakdown Voltage*, Solid-State Elec., Vol. 38, No. 4, pp. 801–806 (1995), the disclosure of which is hereby incorporated herein by reference.

In particular, better than theoretically ideal breakdown voltage characteristics were achieved because of the occurrence of charge coupling between the majority charge carriers in the mesa-shaped portion of the epitaxial/drift region and the metal on the insulated sidewalls of the trenches. This charge coupling produced a redistribution of the electric field profile under the Schottky contact which resulted in a breakdown voltage of about 25 Volts being achieved for a uniform drift region doping concentration of $1 \times 10^{17}$ cm$^{-3}$ and oxide thickness of 500 Å, as opposed to 9.5 Volts for an ideal abrupt parallel-plane rectifier. Furthermore, because the peak electric field at the metal-semiconductor contact was reduced relative to an ideal rectifier, reverse leakage current was also reduced.

The redistribution of the electric field profile, relative to an ideal parallel-plane rectifier with drift region doping concentration of $3 \times 10^{16}$ cm$^{-3}$, is illustrated by FIG. 7 for various trench depths ("d"). FIG. 7 is a reproduction of FIG. 2 from the aforementioned Mehrotra and Baliga article. As shown by FIG. 7, there are at least two distinct effects associated with the charge coupling between the trench electrodes and mesa. First, the electric field at center of the Schottky contact is reduced significantly and second, the peak in the electric field profile shifts away from the metal-semiconductor contact and into the drift region. The reduction in electric field at the center of the Schottky contact causes a significant decrease in the reverse leakage current through a reduction in Schottky barrier height lowering and as the peak of the electric field moves away from the Schottky contact, the mesa is able to support more voltage than parallel-plane theory predicts.

A graphical illustration of breakdown voltage versus trench oxide thickness for the TMBS rectifier of FIG. 6 is illustrated by FIG. 8, which is a reproduction of FIG. 4(b) from the aforementioned Mehrotra and Baliga article. As shown by FIG. 8, increases in oxide thickness beyond 750 Å cause a significant decrease in breakdown voltage. This decrease in breakdown voltage with increasing oxide thickness can be attributed to reduced charge coupling between the anode electrode on the trench sidewalls and the mesa-shaped portion of the drift region. A graphical illustration of breakdown voltage versus trench depth for the TMBS rectifier of FIG. 6 is also illustrated by FIG. 9, which is a reproduction of FIG. 3 from the aforementioned Mehrotra and Baliga article. As shown by FIG. 9, increases in trench depth beyond 2.5 µm do not cause a continuing increase in breakdown voltage beyond 25 Volts.

Notwithstanding these developments, however, there continues to be a need for even more efficient rectifiers which are capable of blocking even higher voltages with less reverse leakage current than the aforementioned devices, including the TMBS rectifier.

SUMMARY OF THE INVENTION

It is therefore an object of the present invention to provide efficient rectifiers and methods of forming same.

It is also an object of the present invention to provide rectifiers which are capable of sustaining high forward biased current densities with low forward voltage drop and methods of forming same.

It is another object of the present invention to provide rectifiers capable of sustaining high reverse blocking voltages with low reverse leakage currents and methods of forming same.

These and other objects, features and advantages are provided according to the present invention, by a Schottky rectifier having insulator-filled trenches and an anode electrode thereon at a face of a semiconductor substrate and an optimally nonuniformly doped drift region therein which in combination provide high blocking voltage capability with low reverse-biased leakage current and low forward voltage drop. To achieve these benefits, the drift region is preferably nonuniformly doped with first conductivity type dopants so that a concentration of these dopants increases monotonically in a direction away from the Schottky rectifying junction formed between the anode electrode and the drift region. This nonuniform doping is preferably achieved by performing computer-controlled in-situ doping during epitaxial growth of the drift region on a more highly doped cathode region.

In particular, the profile of the doping concentration in the drift region is preferably a linear or step graded profile with a concentration of less than about $5 \times 10^{16}$ cm$^{-3}$ (e.g., $1 \times 10^{16}$ cm$^{-3}$) at the Schottky rectifying junction and a concentration of about ten times greater (e.g., $3 \times 10^{17}$ cm$^{-3}$) at the junction between the drift region and the cathode region. The doping profile and concentrations are also preferably selected so that when the rectifier is reverse biased at the onset of breakdown, the electric field profile in the drift region is substantially uniform and/or negatively sloped to have a monotonically decreasing profile in a direction from the Schottky rectifying junction to the cathode region. The thickness of the insulating regions (e.g., SiO$_2$) on the sidewalls of the trenches can also be increased from 500 Å to greater than about 1000 Å to simultaneously inhibit field crowding and increase the breakdown voltage of the device even though some loss in charge coupling may occur.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 10A:
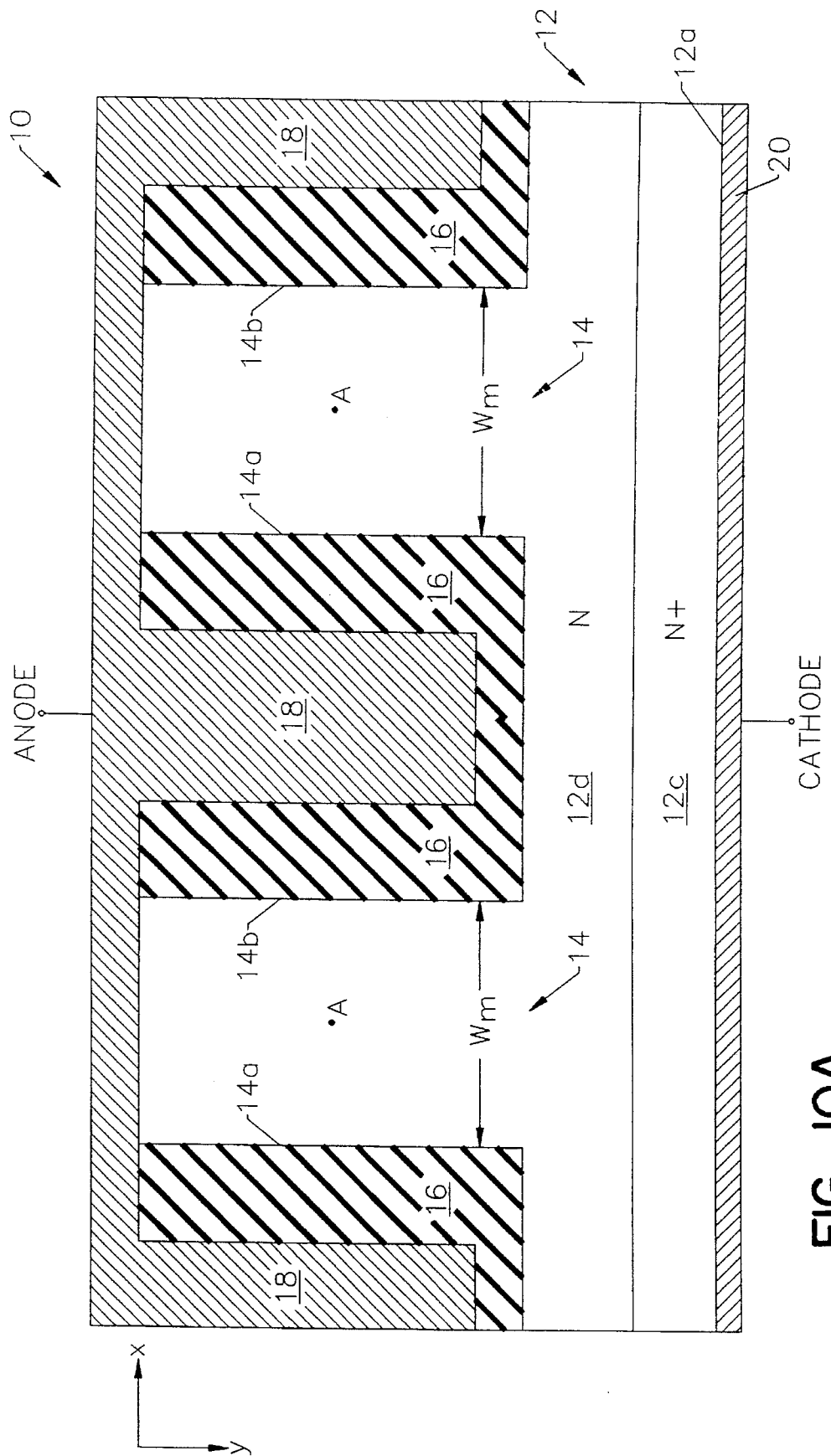
FIG. 10A illustrates a cross-sectional representation of a Schottky rectifier according to one embodiment of the present invention.

Referring now to FIG. 10A, a cross-sectional illustration of a Schottky barrier rectifier according to the present invention is shown. The rectifier 10 includes a semiconductor substrate 12 of first conductivity type, typically N-type conductivity, having a first face 12a and a second opposing face 12b. The substrate 12 preferably comprises a relatively highly doped cathode region 12c (shown as N+) adjacent the first face 12a. As illustrated, the cathode region 12c is doped to a uniform first conductivity type dopant concentration of about $1\times10^{19}$ cm$^{-3}$. An optimally nonuniformly doped drift region 12d of first conductivity type (shown as N) preferably extends from the cathode region 12c to the second face 12b. As illustrated, the drift region 12d and cathode region 12c form a non-rectifying N+/N junction which extends opposite the first face 12a. A mesa 14 having a cross-sectional width "$W_m$", defined by opposing sides 14a and 14b, is preferably formed in the drift region 12d. The mesa 14 can be of stripe, rectangular, cylindrical or other similar geometry and extends in a third dimension (not shown). As will be understood by those skilled in the art, the mesa 14 can be formed in the drift region 12d by etching pairs of adjacent stripe-shaped trenches which extend in a third dimension (not shown), using conventional processing techniques. Alternatively, an annular-shaped trench may also be formed in the drift region 12d to define the mesa 14. However, when viewed in transverse cross section, the inner sidewall of the annular trench appears as a pair of opposing sidewalls 14a and 14b of adjacent trenches and will be described as such.

An insulating region 16 (e.g., SiO$_2$) is also provided on the opposing mesa sides 14a and 14b, respectively. To facilitate achievement of a high breakdown voltage and inhibit field crowding, the insulating region 16 is formed to have a thickness greater than 1000 Å, and more preferably about 2000 Å. The rectifier also includes an anode electrode 18 on the insulating region 16 and on the second face 12b. The anode electrode 18 forms a Schottky barrier rectifying junction with the drift region 12d at the top face of the mesa 14. The height of the Schottky barrier formed at the anode electrode/mesa interface is dependent on the type of electrode metal and semiconductor (e.g., Si, Ge, GaAs, and SiC) used and the magnitude and profile of the first conductivity type doping concentration in the mesa 14. Finally, a cathode electrode 20 is provided adjacent the cathode region 12c at the first face 12a. The cathode electrode 20 preferably ohmically contacts the cathode region 12c.

Because the anode electrode 18 is formed on the insulating region 16, opposite the mesa sides 14a, 14b, charge coupling occurs between the anode electrode 18 and the mesa 14 when the Schottky rectifying junction is reverse biased. As described in the aforementioned article by Mehrotra and Baliga entitled *Trench MOS Barrier Schottky (TMBS) Rectifier*, the thickness of the insulating region 16 and the width and height of the mesa 14 are among the critical parameters governing the degree of charge coupling between the anode electrode 18 and the mesa 14 and the reverse breakdown voltage capability. For example, as described more fully in the Mehrotra and Baliga article, an insulating region thickness of 500 Å was chosen as optimum for a prior art TMBS rectifier having a trench depth of 2.0 µm, mesa width of 0.5 µm and uniform mesa/drift region doping concentration of $1\times10^{17}$ cm$^{-3}$. Using these parameters, a reverse breakdown voltage of about 25 Volts was achieved.

Figure 10B:
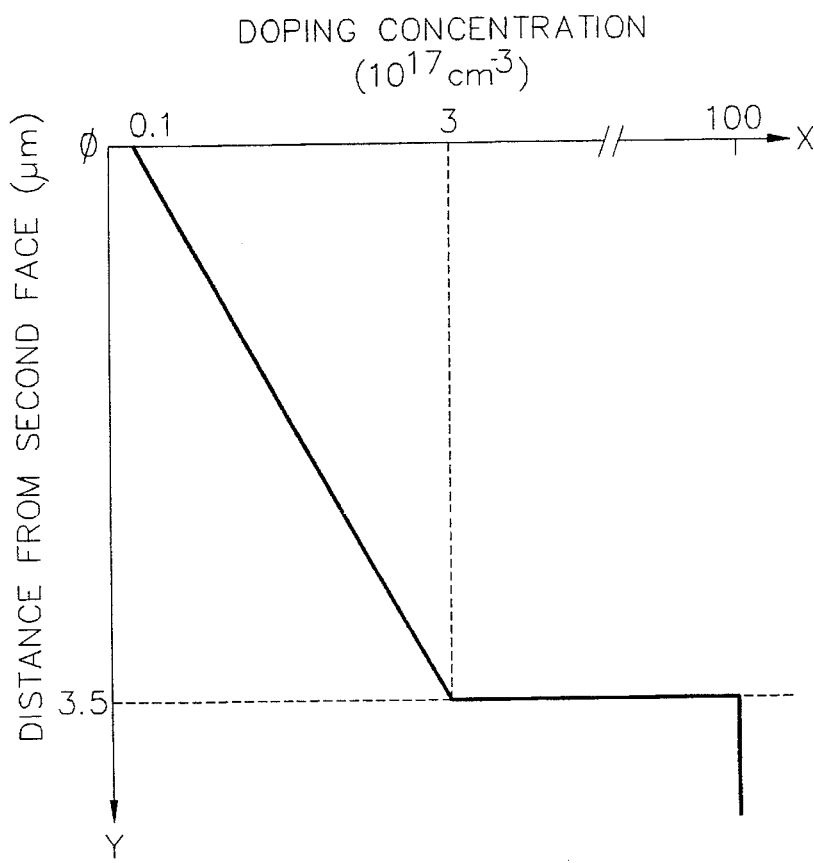
FIG. 10B illustrates the doping concentration in the drift and cathode regions of the Schottky rectifier of FIG. 10A, as a function of distance.

However, a significantly higher reverse breakdown voltage of about 60 Volts can be achieved with the rectifier of FIG. 10A by, among other things, nonuniformly doping the drift region 12d so that the concentration of first conductivity type dopants therein preferably increases monotonically from less than about $5\times10^{16}$ cm$^{-3}$, and more preferably less than about $2\times10^{16}$ cm$^{-3}$, to greater than about $1\times10^{17}$ cm$^{-3}$, in a direction (shown by the y-axis) from the second face 12b to the cathode region 12c. This direction is orthogonal to the second face 12b and the Schottky rectifying junction formed by the anode electrode 18 and mesa 14. In particular, the concentration of first conductivity type dopants in the drift region 12d is most preferably about $1\times10^{16}$ cm$^{-3}$ at the second face 12b and most preferably about $3\times10^{17}$ cm$^{-3}$ at the nonrectifying junction. As also illustrated best by FIG. 10B, the profile of the first conductivity type dopant concentration in the drift region 12d is preferably a linear graded profile, however a step, curve or similarly graded profile can be utilized as well. As will be understood by those skilled in the art, the described profiles of the first conductivity type dopants can be achieved by epitaxially growing the drift region 12d on the cathode region 12c and performing computer-controlled in-situ doping by varying the concentration of the first conductivity type dopants as a function of growth time.

In addition to nonuniformly doping the drift region 12d in an optimum manner as described, increasing the height of the mesa 14 (or trench depth) to about 3.0 µm and increasing the thickness of the insulating region 16 from 500 Å to greater than about 1000 Å, and most preferably to about 2000 Å, also contributes to an increase in the reverse breakdown voltage. For example, the reverse breakdown voltage was about 60 Volts for the rectifier of FIG. 10A having a drift region thickness of about 3.5 µm and a mesa width of about 0.4 µm. This 60 Volt breakdown voltage level is more than two times greater than the breakdown voltage level of the device described in the aforementioned Mehrotra and Baliga article. The increase in reverse breakdown voltage to 60 Volts can be attributed, in part, to the achievement of a substantially uniform vertical electric field profile at the center of the mesa 14, at the onset of breakdown.

Figure 1:
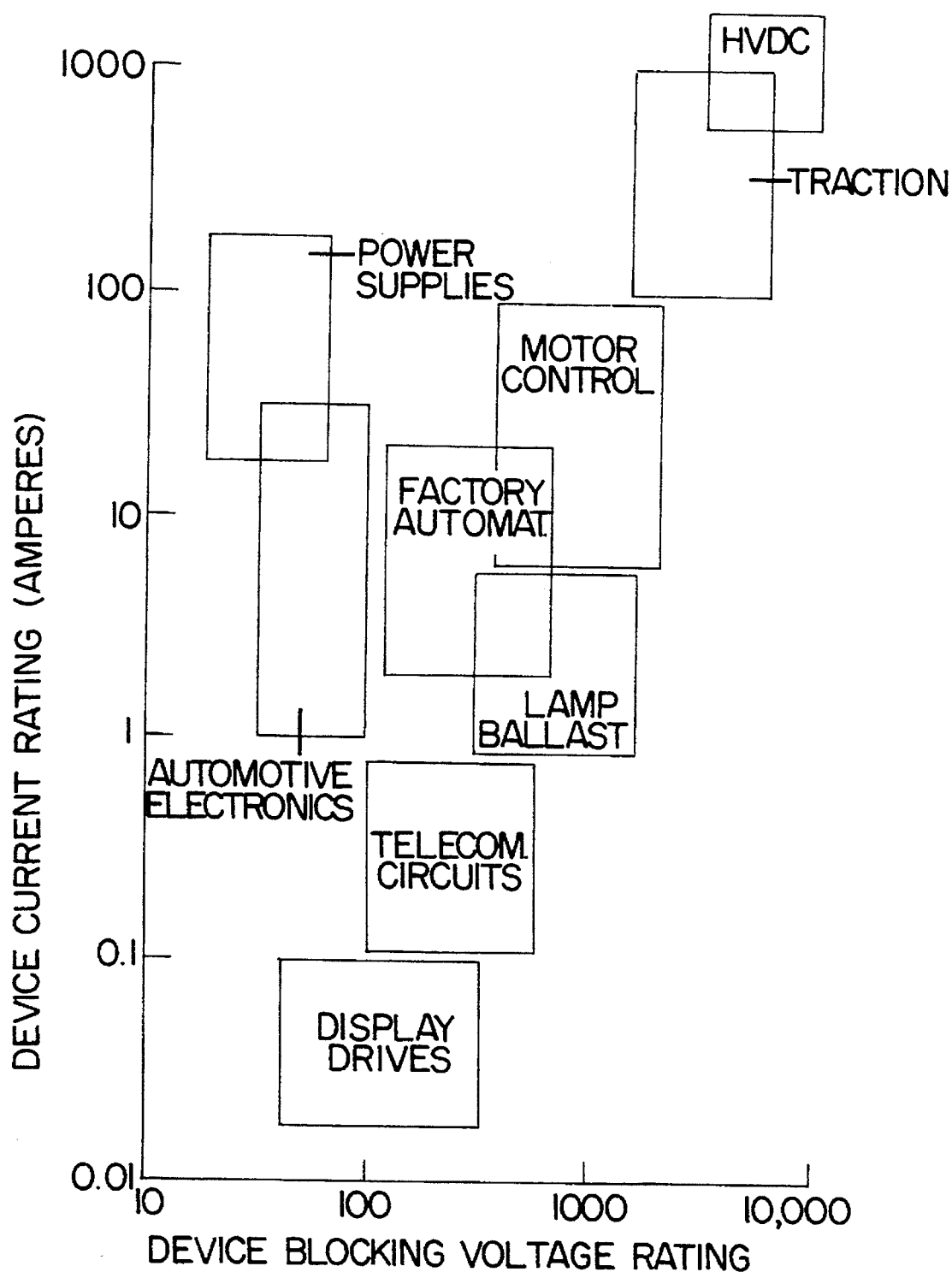
FIG. 1 illustrates typical applications of power semiconductor devices as a function of device current rating and device blocking voltage rating.
Figure 2:
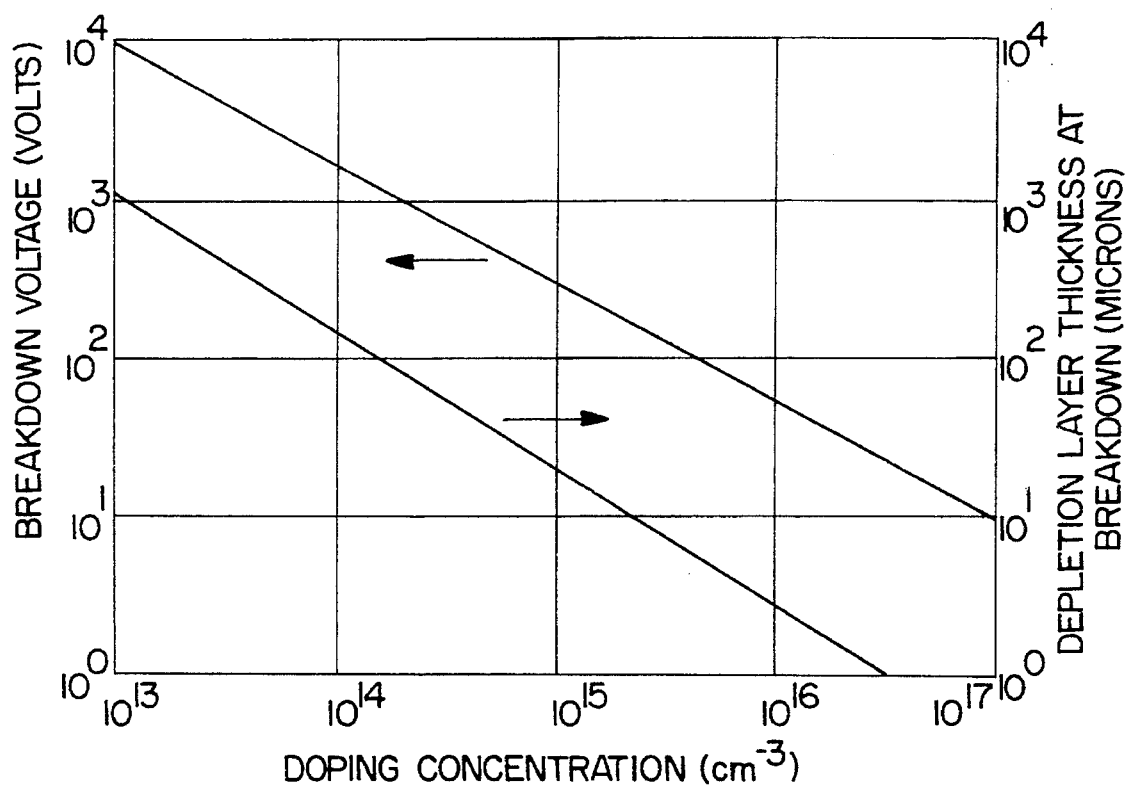
FIG. 2 is a graphical illustration of breakdown voltage and depletion layer thickness versus doping concentration for a parallel-plane abrupt silicon P-N junction.
Figure 3:
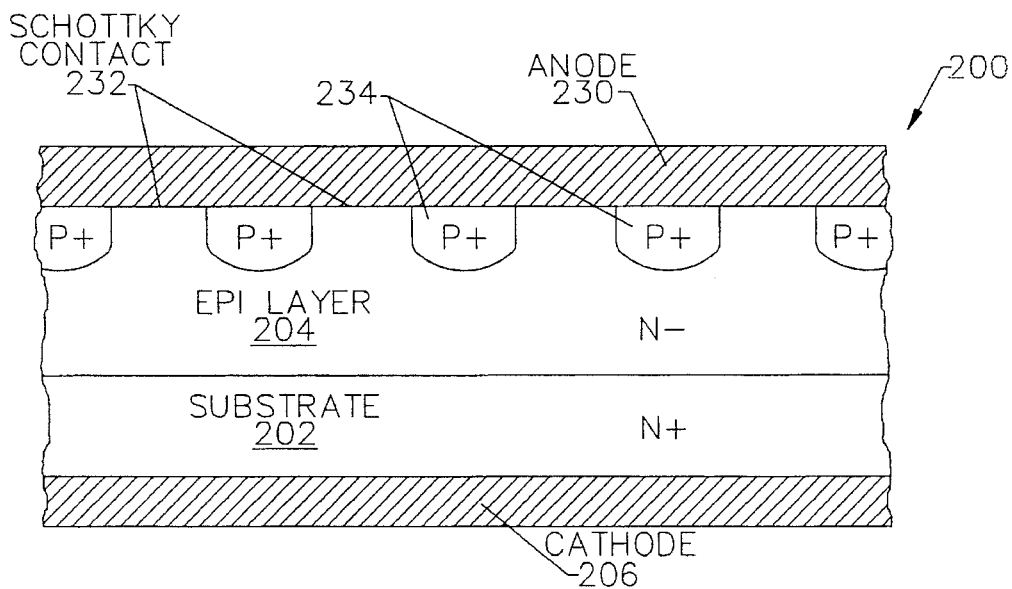
FIG. 3 illustrates a cross-sectional representation of a prior art pinch rectifier, according to FIG. 6 of U.S. Pat. No. 4,641,174.
Figure 4:
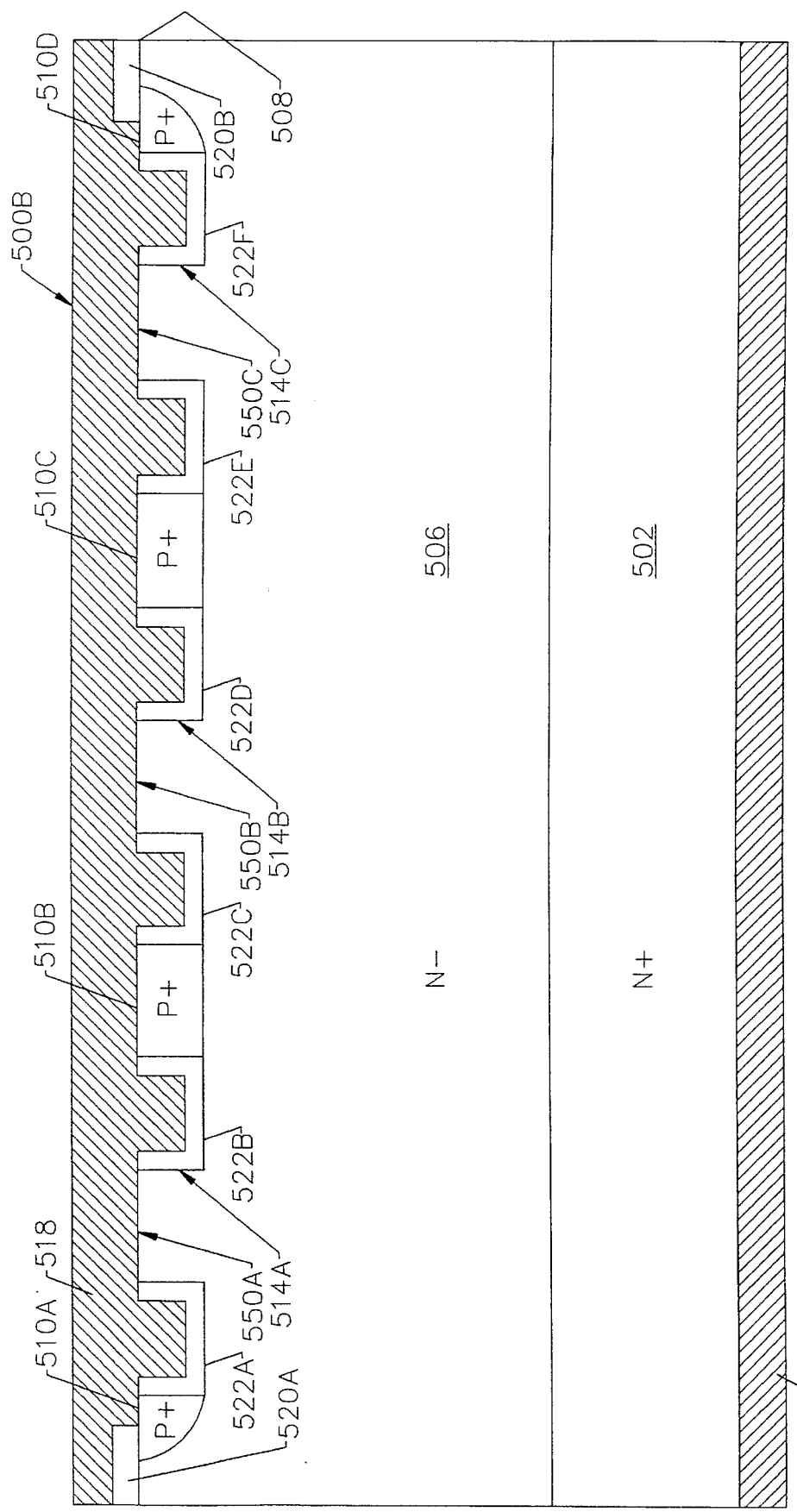
FIG. 4 illustrates a cross-sectional representation of a prior art P-i-N rectifier, according to FIG. 10B of U.S. Pat. No. 4,982,260.
Figure 5:
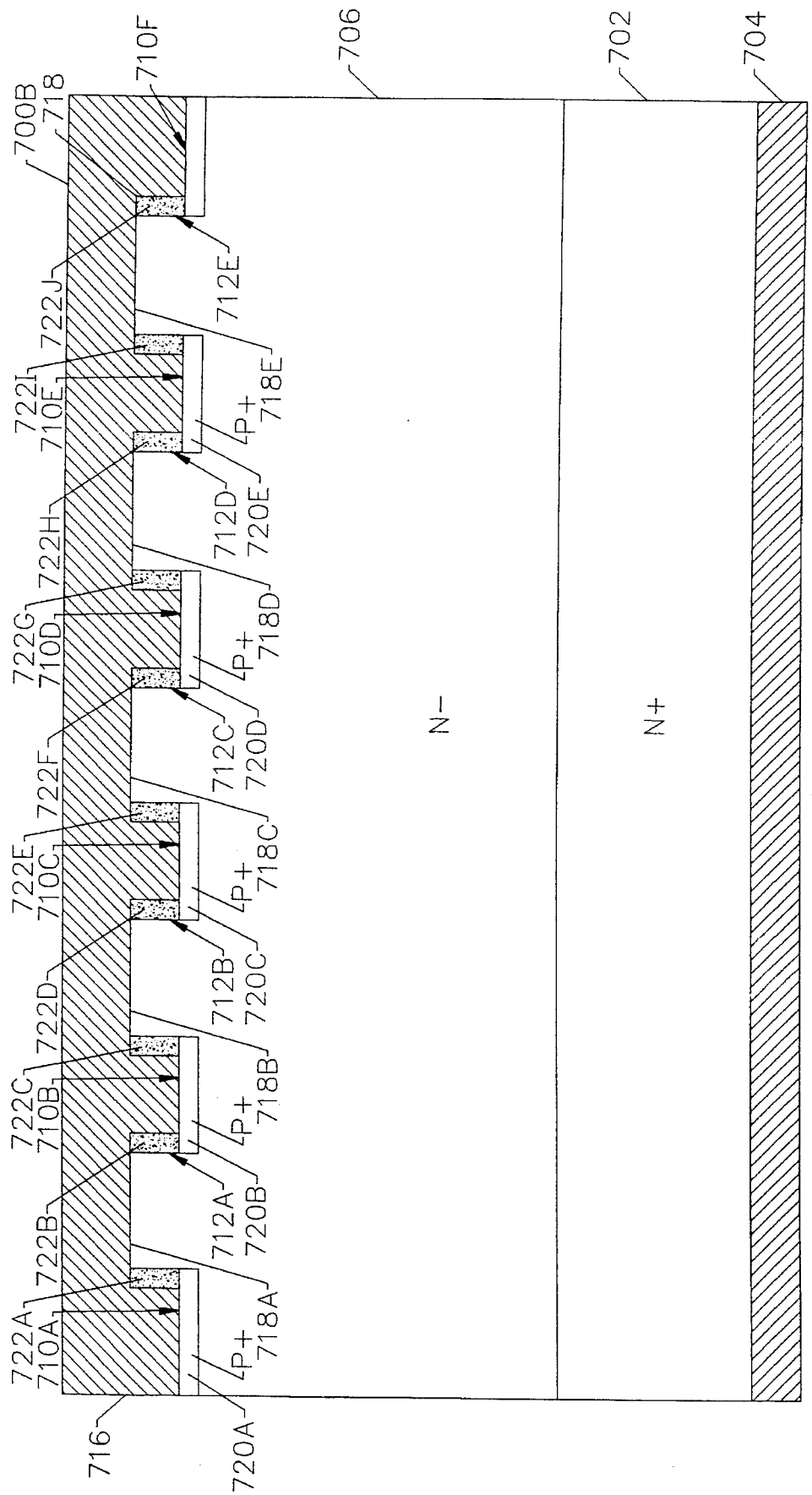
FIG. 5 illustrates a cross-sectional representation of a prior art P-i-N rectifier, according to FIG. 14B of U.S. Pat. No. 4,982,260.
Figure 6:
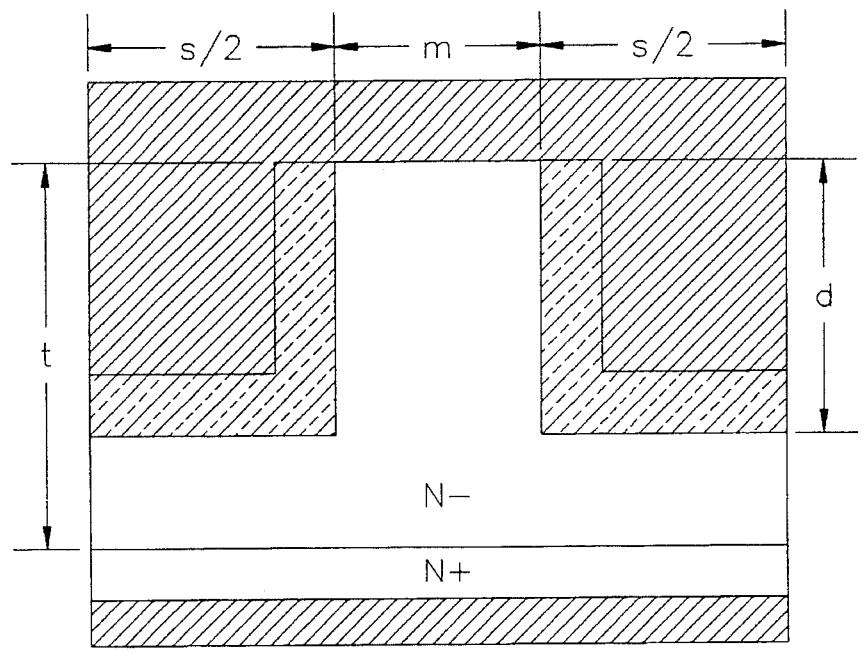
FIG. 6 illustrates a cross-sectional representation of a trench MOS barrier Schottky rectifier (TMBS) according to the prior art.
Figure 7:
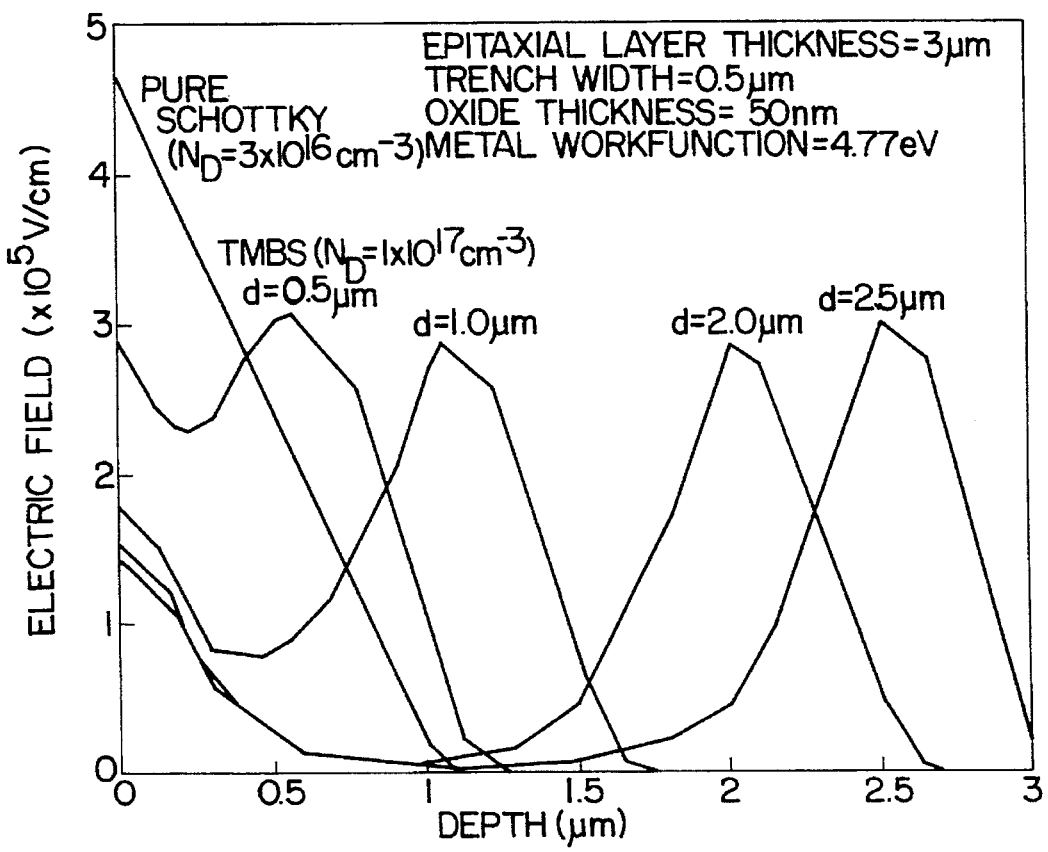
FIG. 7 is a graphical illustration of electric field profiles in an ideal parallel-plane abrupt P-N junction and the TMBS rectifier of FIG. 6, under reverse bias conditions.
Figure 11:
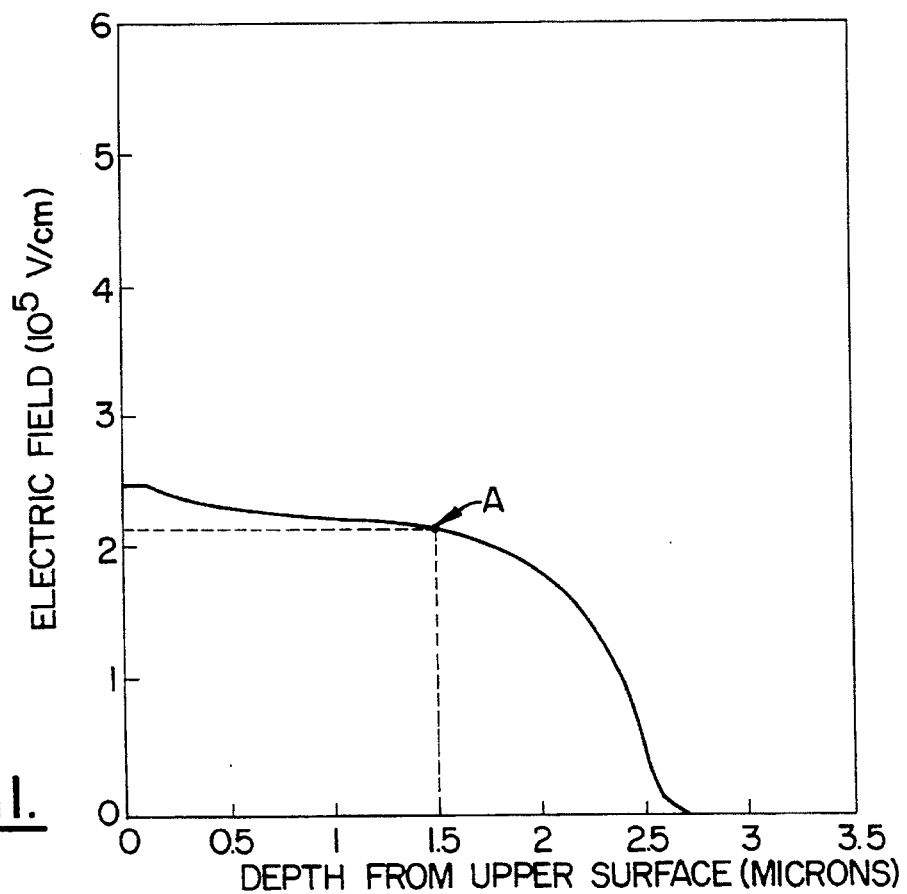
FIG. 11 is a graphical illustration of an electric field profile in the drift region of the Schottky rectifier of FIG. 10A, at the onset of reverse-bias breakdown.

The profile of the electric field in the center of the mesa 14 versus distance from the second face 12b is best illustrated by FIG. 11. As illustrated, the electric field profile is substantially uniform, relative to the profiles of FIG. 7 for the TMBS rectifier. However, flat and negative slopes are present so that the actual profile of the electric field strength is monotonically decreasing in an orthogonal direction from the second face 12b to the cathode region 12c. Moreover, in contrast to the electric field profile of FIG. 7 which illustrates two peak electric field values, one at the Schottky junction and one at a distance therefrom which is equal to the trench depth of 2.0 µm, the electric field profile in FIG. 11 has a single peak at the second face 12b and the field at point "A" at the center of the mesa 14 and at a distance 1.5 µm from the face 12b (i.e., half the trench depth) is greater than about one-half the peak electric field and more preferably, greater than about 80% of the peak electric field. This substantially uniform electric field profile at the vertical center of the mesa 14 contributes to the achievement of high reverse breakdown voltage. This preferred electric field profile is also a consequence of the nonuniform drift region doping concentration and increased insulating region thickness.

Figure 8:
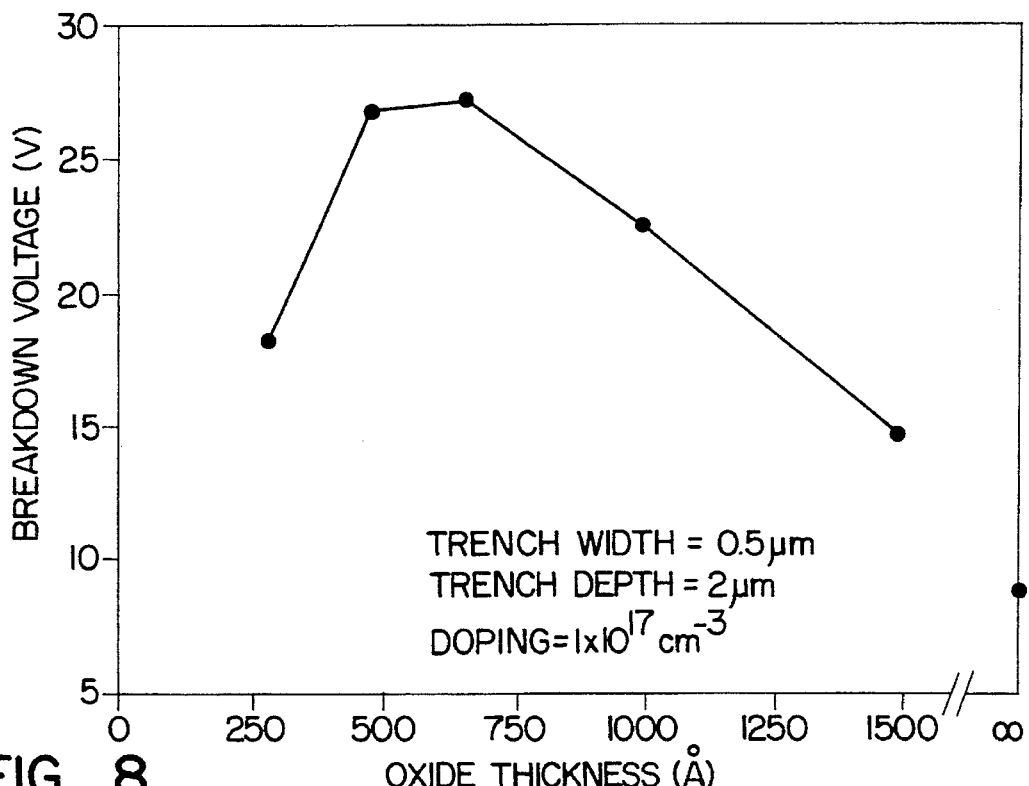
FIG. 8 is a graphical illustration of breakdown voltage versus trench oxide thickness for the TMBS rectifier of FIG. 6.
Figure 9:
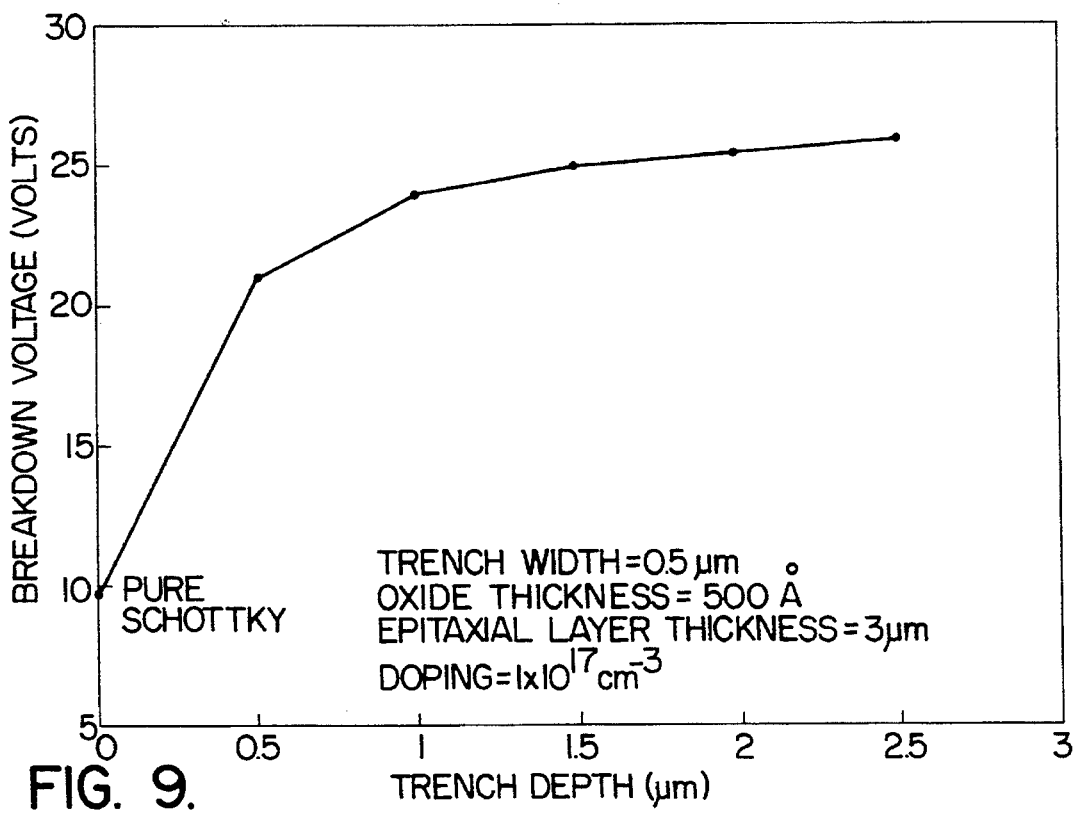
FIG. 9 is a graphical illustration of breakdown voltage versus trench depth for the TMBS rectifier of FIG. 6.
Figure 12:
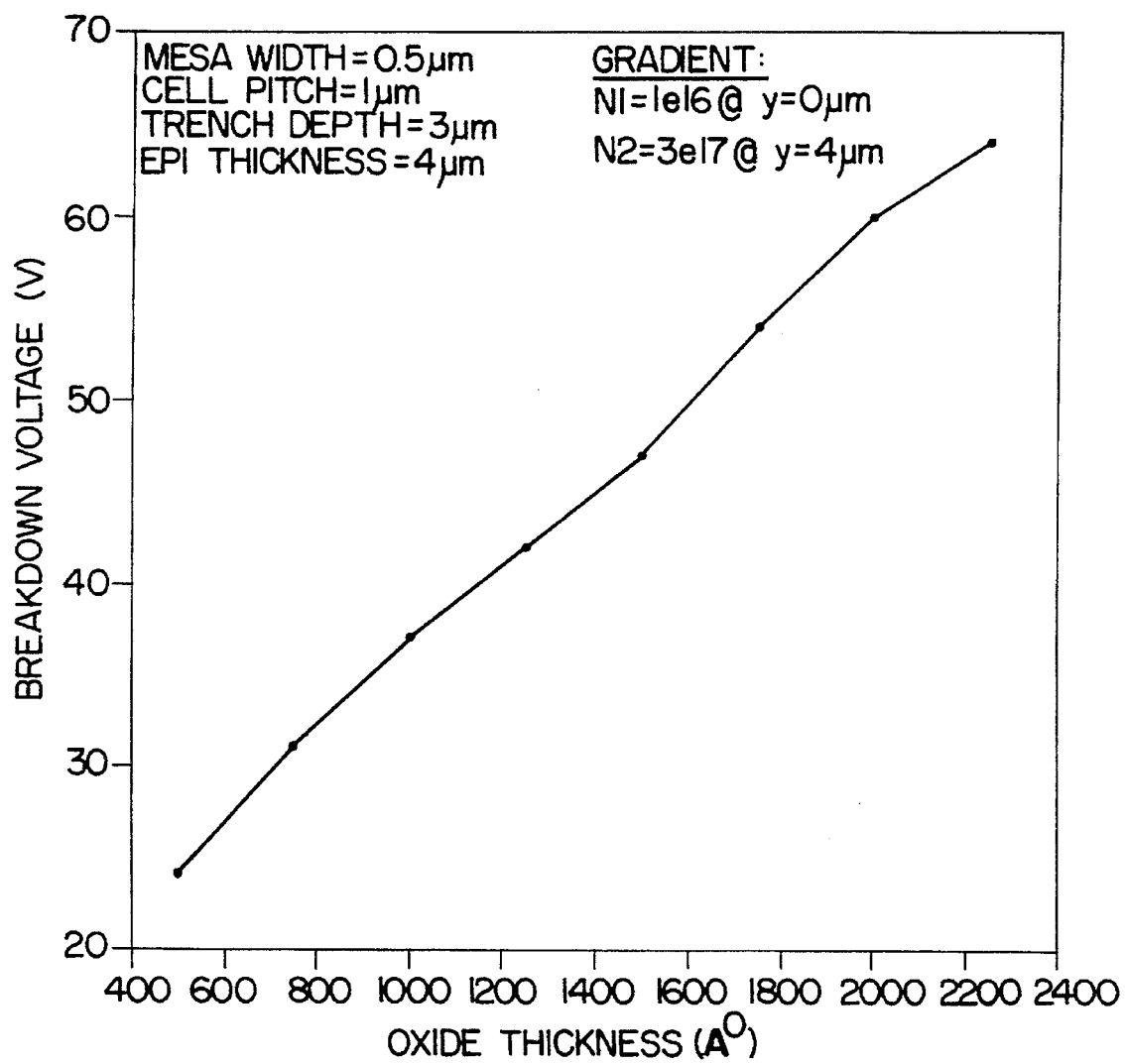
FIG. 12 is a graphical illustration of breakdown voltage versus trench oxide thickness for a Schottky rectifier according to the present invention.
Figure 13:
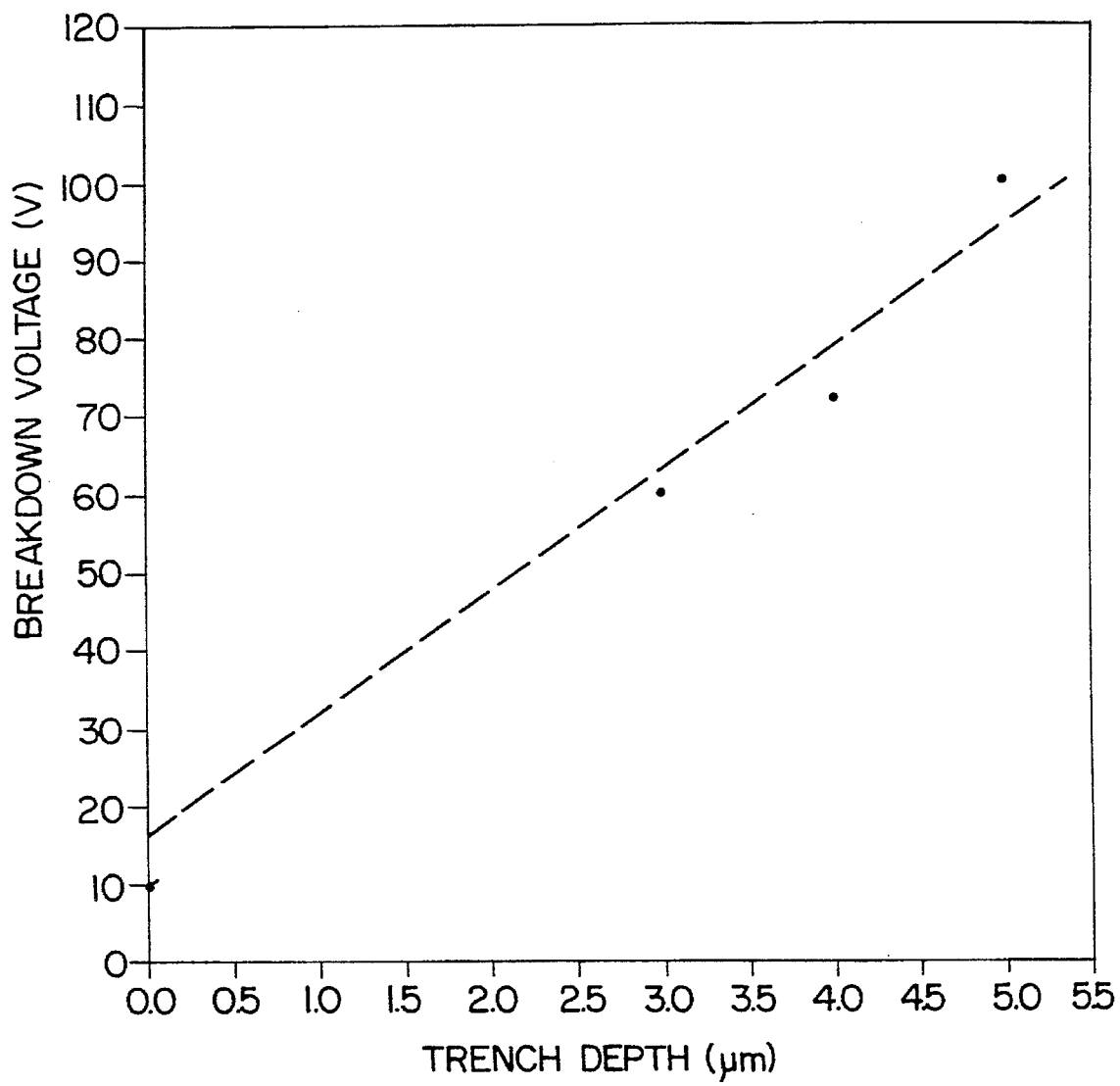
FIG. 13 is a graphical illustration of breakdown voltage versus trench depth for a Schottky rectifier according to the present invention.

Referring now to FIG. 12, a graphical illustration of breakdown voltage versus trench oxide thickness for a Schottky rectifier according to the present invention, is provided. In particular, the breakdown voltage is shown as monotonically increasing with oxide thickness up to at least 2200 Å, which is not disclosed or suggested by the profile of FIG. 8. The graphical illustration of FIG. 12 was obtained for a Schottky rectifier having a doping profile in accordance with FIG. 10B with limits of $1\times10^{16}$ cm$^{-3}$ at the second face 12b and $3\times10^{17}$ cm$^{-3}$ at the nonrectifying junction formed by the drift region 12d and cathode region 12c. The mesa width and cell pitch were also 0.5 µm and 1 µm, respectively, and the trench depth and thickness of the drift region 12d were 3 µm and 4 µm, respectively. A graphical illustration of breakdown voltage versus trench depth for a Schottky rectifier according to the present invention is also provided in FIG. 13. In contrast to FIG. 9, the breakdown voltage is also shown as increasing in an approximate straight line manner as a function of trench depth for depths up to at least 5.0 µm. In particular, a breakdown voltage of about 100 Volts can be achieved with a trench depth of 5.0 µm.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A Schottky rectifier, comprising:
    a semiconductor substrate having first and second opposing faces;
    a cathode region of first conductivity type in said semiconductor substrate, adjacent the first face;
    a drift region of first conductivity type in said semiconductor substrate, said drift region extending between said cathode region and the second face and having a concentration of first conductivity type dopants therein which increases monotonically in a direction from the second face to said cathode region;
    a cathode electrode contacting said cathode region;
    a trench in said semiconductor substrate at the second face, said trench having a bottom and sidewall extending adjacent said drift region;
    an insulating region on the sidewall; and
    an anode electrode on the second face and on said insulating region, said anode electrode forming a Schottky rectifying junction with said drift region at the second face.

2. The Schottky rectifier of claim 1, wherein said drift region forms a nonrectifying junction with said cathode region and wherein the concentration of first conductivity type dopants in said drift region is greater than about $1\times10^{17}$ cm$^{-3}$ at the nonrectifying junction.

3. The Schottky rectifier of claim 2, wherein the concentration of first conductivity type dopants in said drift region is less than about $2\times10^{16}$ cm$^{-3}$ at the second face.

4. The Schottky rectifier of claim 3, wherein a profile of the concentration of first conductivity type dopants in said drift region is a linear graded profile.

5. The Schottky rectifier of claim 3, wherein a profile of the concentration of first conductivity type dopants in said drift region is a step graded profile.

6. The Schottky rectifier of claim 1, wherein the concentration of first conductivity type dopants in said drift region at the second face is less than about $5\times10^{16}$ cm$^{-3}$; wherein said drift region forms a nonrectifying junction with said cathode region; and wherein the concentration of first conductivity type dopants in said drift region at the nonrectifying junction is greater than about ten times the concentration of first conductivity type dopants in said drift region at the second face.

7. The Schottky rectifier of claim 6, wherein said insulating region on the sidewall has a thickness greater than 1000 Å.

8. The Schottky rectifier of claim 6, wherein a profile of the concentration of first conductivity type dopants in said drift region is a linear graded profile.

9. The Schottky rectifier of claim 6, wherein a profile of the concentration of first conductivity type dopants in said drift region is a step graded profile.

10. The Schottky rectifier of claim 1, wherein said insulating region on the sidewall has a thickness greater than 1000 Å.

11. A Schottky rectifier, comprising:
    a semiconductor substrate having first and second opposing faces;
    a first trench in said semiconductor substrate at the second face;
    an insulating region on a sidewall and bottom of said first trench;
    a cathode region of first conductivity type in said semiconductor substrate, adjacent the first face;
    a cathode electrode electrically coupled to said cathode region, at the first face;
    an anode electrode on the second face and on said insulating region; and
    a drift region of first conductivity type in said semiconductor substrate, said drift region forming a Schottky rectifying junction with said anode electrode, extending between said cathode region and the second face and having a concentration of first conductivity type dopants therein which is nonuniform in a direction orthogonal to the second face so that when said anode electrode is reverse biased relative to said cathode electrode an electric field profile which is entirely monotonically decreasing in a direction from the second face to said cathode region is established in said drift region.

12. The Schottky rectifier of claim 11, wherein said drift region forms a nonrectifying junction with said cathode region and wherein the concentration of first conductivity type dopants in said drift region is greater than about $1\times10^{17}$ cm$^{-3}$ at the nonrectifying junction.

13. The Schottky rectifier of claim 12, wherein the concentration of first conductivity type dopants in said drift region is less than about $2\times10^{16}$ cm$^{-3}$ at the second face.

14. The Schottky rectifier of claim 13, wherein a profile of the concentration of first conductivity type dopants in said drift region is a linear graded profile.

15. The Schottky rectifier of claim 13, wherein a profile of the concentration of first conductivity type dopants in said drift region is a step graded profile.

16. The Schottky rectifier of claim 11, wherein the concentration of first conductivity type dopants in said drift region is less than about $5\times10^{16}$ cm$^{-3}$ at the second face; wherein said drift region forms a nonrectifying junction with said cathode region; and wherein the concentration of first conductivity type dopants in said drift region at the nonrectifying junction is greater than about ten times the concentration of first conductivity type dopants in said drift region at the second face.

17. The Schottky rectifier of claim 16, wherein said insulating region on the sidewall of said first trench has a thickness greater than 1000 Å.

18. The Schottky rectifier of claim 16, wherein a profile of the concentration of first conductivity type dopants in said drift region is a linear graded profile.

19. The Schottky rectifier of claim 16, wherein a profile of the concentration of first conductivity type dopants in said drift region is a step graded profile.

20. The Schottky rectifier of claim 11, wherein said insulating region on the sidewall of said first trench has a thickness greater than 1000 Å.

21. The Schottky rectifier of claim 11, further comprising a second trench in said semiconductor substrate at the second face and adjacent said first trench to thereby define a mesa containing said drift region therein; wherein said insulating region extends on a sidewall and bottom of said second trench; wherein said anode electrode forms a Schottky rectifying junction with the mesa at the second face; and wherein a concentration of first conductivity type dopants in the mesa is nonuniform in a direction orthogonal to the second face so that when said anode electrode is reversed biased relative to said cathode electrode an electric field profile, which is entirely monotonically decreasing in a direction from the second face to said cathode region, is established in a center of the mesa, as measured between the sidewalls of said first and second trenches.

22. The Schottky rectifier of claim 21, wherein said insulating region on the sidewall of said first trench has a thickness greater than 1000 Å.

23. The Schottky rectifier of claim 22, wherein the concentration of first conductivity type dopants in said drift region is less than about $5 \times 10^{16}$ cm$^{-3}$ at the second face; wherein said drift region forms a nonrectifying junction with said cathode region; and wherein the concentration of first conductivity type dopants in said drift region at the nonrectifying junction is greater than about ten times the concentration of first conductivity type dopants in said drift region at the second face.

24. A Schottky rectifier, comprising:
a semiconductor substrate having first and second opposing faces, a pair of adjacent trenches of first depth at the second face, a cathode region of first conductivity type extending adjacent the first face and a drift region extending from said cathode region and between the pair of adjacent trenches to the second face, said drift region having a concentration of first conductivity type dopants therein which is nonuniform in a direction orthogonal to the second face;
an insulating region on sidewalls of the pair of adjacent trenches;
an anode electrode on said insulating region and on the second face, said anode electrode forming a Schottky barrier rectifying junction with said drift region at the second face;
a cathode electrode on the first face; and
wherein the nonuniformity of the concentration of first conductivity type dopants in said drift region is selected so that at the onset of reverse-bias breakdown of the Schottky barrier rectifying junction, the electric field in said drift region at a first position, which is equidistant from each of the pair of adjacent trenches and spaced from the second face by a distance equal to one-half the first depth, is greater than one-half the electric field in said drift region at a second position at the second face which is equidistant from each of the pair of trenches.

25. The Schottky rectifier of claim 24, wherein said drift region forms a nonrectifying junction with said cathode region and wherein the concentration of first conductivity type dopants in said drift region is greater than about $1 \times 10^{17}$ cm$^{-3}$ at the nonrectifying junction.

26. The Schottky rectifier of claim 25, wherein the concentration of first conductivity type dopants in said drift region is less than about $2 \times 10^{16}$ cm$^{-3}$ at the second face.

27. The Schottky rectifier of claim 26, wherein a profile of the concentration of first conductivity type dopants in said drift region is a linear graded profile.

28. The Schottky rectifier of claim 26, wherein a profile of the concentration of first conductivity type dopants in said drift region is a step graded profile.

29. The Schottky rectifier of claim 26, wherein said insulating region has a thickness greater than 1000 Å.

30. A Schottky rectifier, comprising:
a silicon cathode region of first conductivity type;
a nonuniformly doped silicon drift region of first conductivity type on said silicon cathode region and forming a non-rectifying junction therewith, said drift region having a face thereon and a thickness of at least about 3.5 μm as measured between the face and the nonrectifying junction;
first and second adjacent trenches having depths of at least about 3.0 μm, at the face;
an insulating region having a thickness greater than about 1500 Å on sidewalls of the first and second adjacent trenches;
an anode electrode on said insulating region and forming a Schottky barrier rectifying junction having a reverse-bias breakdown voltage greater than about 50 Volts with said drift region, at the face; and
a cathode electrode on said cathode region.

31. The Schottky rectifier of claim 30, wherein a first conductivity type doping concentration in said drift region is greater than about $1 \times 10^{17}$ cm$^{-3}$ at the non-rectifying junction and less than about $2 \times 10^{16}$ cm$^{-3}$ at the Schottky barrier rectifying junction.

32. The Schottky rectifier of claim 31, wherein a width of said drift region, as measured between said first and second adjacent trenches, is less than about 0.5 μm.

33. A Schottky rectifier, comprising:
a semiconductor substrate having first and second opposing faces and a drift region therein extending to the second face;
first and second adjacent trenches of first depth at the second face, said first and second adjacent trenches having sidewalls and bottoms extending adjacent said drift region;
first and second electrically insulating regions lining the sidewalls and bottoms of the first and second adjacent trenches, respectively;
an anode electrode on said first and second electrically insulating regions and on the second face, said anode electrode forming a Schottky barrier rectifying junction with said drift region at the second face;
a cathode electrode electrically coupled to said drift region;
wherein said drift region has a concentration of first conductivity type dopants therein which is nonuniform in a direction orthogonal to the second face; and wherein the nonuniformity of the concentration of first conductivity type dopants in said drift region is selected so that at the onset of reverse-bias breakdown of the Schottky barrier rectifying junction, the electric field in said drift region at a first position, which is equidistant from each of said first and second adjacent trenches and spaced from the second face by a distance equal to one-half the first depth, is greater than one-half the electric field in said drift region at a second position at the second face which is equidistant from each of said first and second adjacent trenches.

34. The Schottky rectifier of claim 33, further comprising a cathode region of first conductivity type in said substrate, said cathode region extending between said drift region and the first face and forming a nonrectifying junction with said drift region; and wherein the concentration of first conductivity type dopants in said drift region is greater than about $1 \times 10^{17}$ cm$^{-3}$ at the nonrectifying junction.

35. The Schottky rectifier of claim 34, wherein the concentration of first conductivity type dopants in said drift region is less than about $2 \times 10^{16}$ cm$^{-3}$ at the second face.

36. The Schottky rectifier of claim 34, wherein a profile of the concentration of first conductivity type dopants in said drift region is a linear graded profile.

37. The Schottky rectifier of claim 34, wherein a profile of the concentration of first conductivity type dopants in said drift region is a step graded profile.

38. The Schottky rectifier of claim 34, wherein said first and second electrically insulating regions have a thickness greater than 1000 Å.

* * * * *